(12) United States Patent
Xu (10) Patent No.: US 7,126,519 B1
(45) Date of Patent: Oct. 24, 2006

(54) LOW-SPUR LOW-DISTORTION DIGITAL-TO-ANALOG CONVERTER

(75) Inventor: Fang Xu, Newton, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 11/241,572

(22) Filed: Sep. 30, 2005

(51) Int. Cl.
*H03M 1/66* (2006.01)

(52) U.S. Cl. ................................. 341/144; 341/145

(58) Field of Classification Search ............... 341/144, 341/145, 152, 153
See application file for complete search history.

(56) References Cited

U.S. PATENT DOCUMENTS

| | | | |
|---|---|---|---|
| 4,128,738 A * | 12/1978 | Gallery | 381/335 |
| 6,405,227 B1 * | 6/2002 | Prakash | 708/300 |
| 6,493,576 B1 * | 12/2002 | Dankwart-Eder | 600/544 |

* cited by examiner

*Primary Examiner*—Brian Young
(74) *Attorney, Agent, or Firm*—Fish & Richardson P.C.

(57) ABSTRACT

A system and method include receiving an input signal; transmitting high-frequency components of the input signal to a first converter; attenuating low-frequency components of the input signal to a predetermined level such that the low-frequency components of dither can be used to correct non-linearity errors introduced by the first converter; transmitting the low-frequency components of the input signal to a second converter; attenuating the high-frequency components of the input signal to a predetermined level such that the high-frequency components of linearization correction and dither can be used to correct non-linearity errors introduced by the second converter; converting the high-frequency components to form a first converted signal; converting the low-frequency components to form a second converted signal; and combining the first and second converted signals to form the output signal.

20 Claims, 9 Drawing Sheets

LOW-SPUR LOW-DISTORTION DIGITAL-TO-ANALOG CONVERTER

TECHNICAL FIELD

This patent application relates to improving the performance of an analog-to-digital converter, and more particularly to improving the spurious-free dynamic range over a wide band of frequencies.

BACKGROUND

A digital-to-analog converter (DAC) converts a digital input code to an analog output signal. The output of a DAC may deviate from the ideal output due to variations in the manufacturing process and due to various sources of inaccuracy in the digital-to-analog conversion process. The transfer function of a DAC is a plot of the signal generated at the DAC output as function of the input code. Such a plot is not continuous but is a plot of $2^N$ steps, where N is the resolution of the DAC in bits. For an ideal DAC, a single straight line can be drawn through the points at each code-transition boundary, beginning at the origin of the plot.

Figure 1:
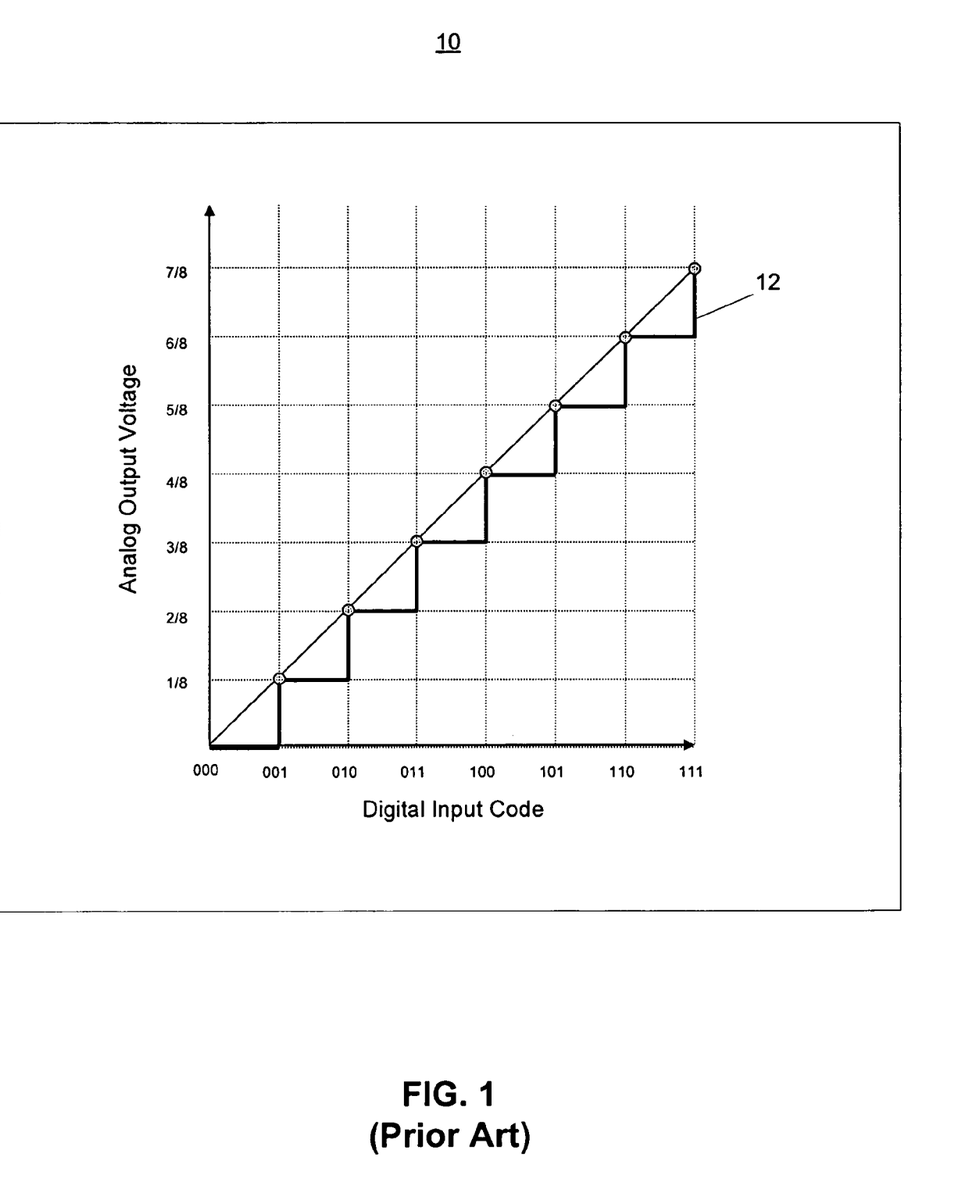
FIG. 1 shows a plot of an ideal transfer function of a digital-to-analog converter (DAC)

FIG. 1 shows a plot 10 an example of an ideal transfer function 12 for a 3-bit DAC with reference points at code transition boundaries. The DAC in this example produces a total of eight steps that each represents a value of a digital input code. The output signal reaches a minimum at code zero (000) and a maximum at code (111). Thus, the transition to the maximum output does not occur at voltage reference, $V_{ref}$. The transition occurs at one code width, which is equal to a least significant bit (LSB). An LSB is $V_{ref}/2N$.

Limitations in the materials used in fabrication and inaccuracies inherent in the conversion process itself cause the actual transfer function of a DAC to deviate from the ideal transfer function.

Figure 2:
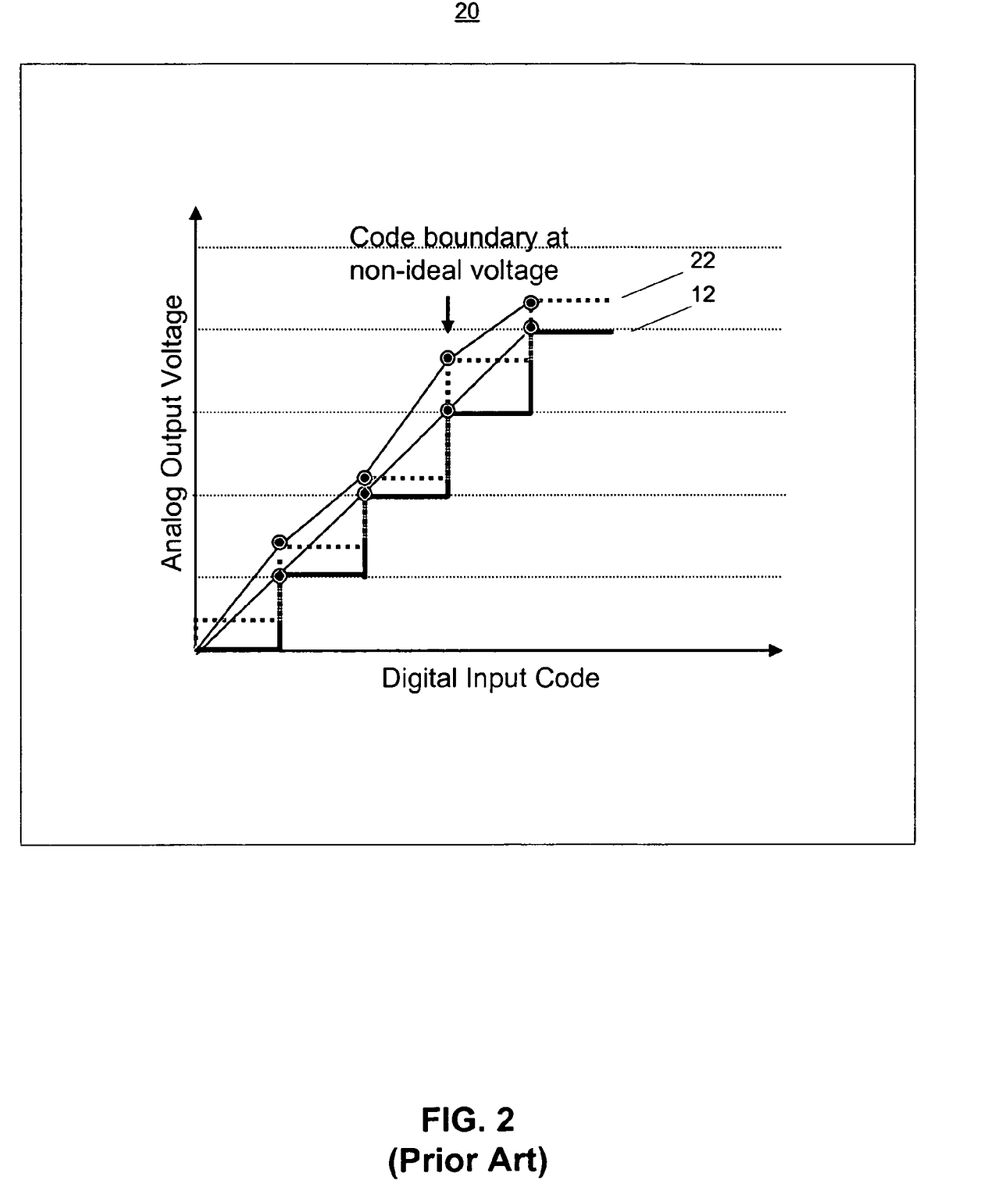
FIG. 2 shows a plot of an actual transfer function of a DAC.

The deviation of a DAC's transfer function from a straight line is referred to as non-linearity. FIG. 2 illustrates a plot 20 of non-linear deviation between the ideal 12 transfer function and the actual transfer function 22 the exemplary 3-bit DAC. The differences between the ideal voltage levels at which code transitions occur and the actual voltage are referred to as non-linear errors. Non-linear errors may be expressed in LSBs (e.g., 1.3 LSB).

Figure 3:
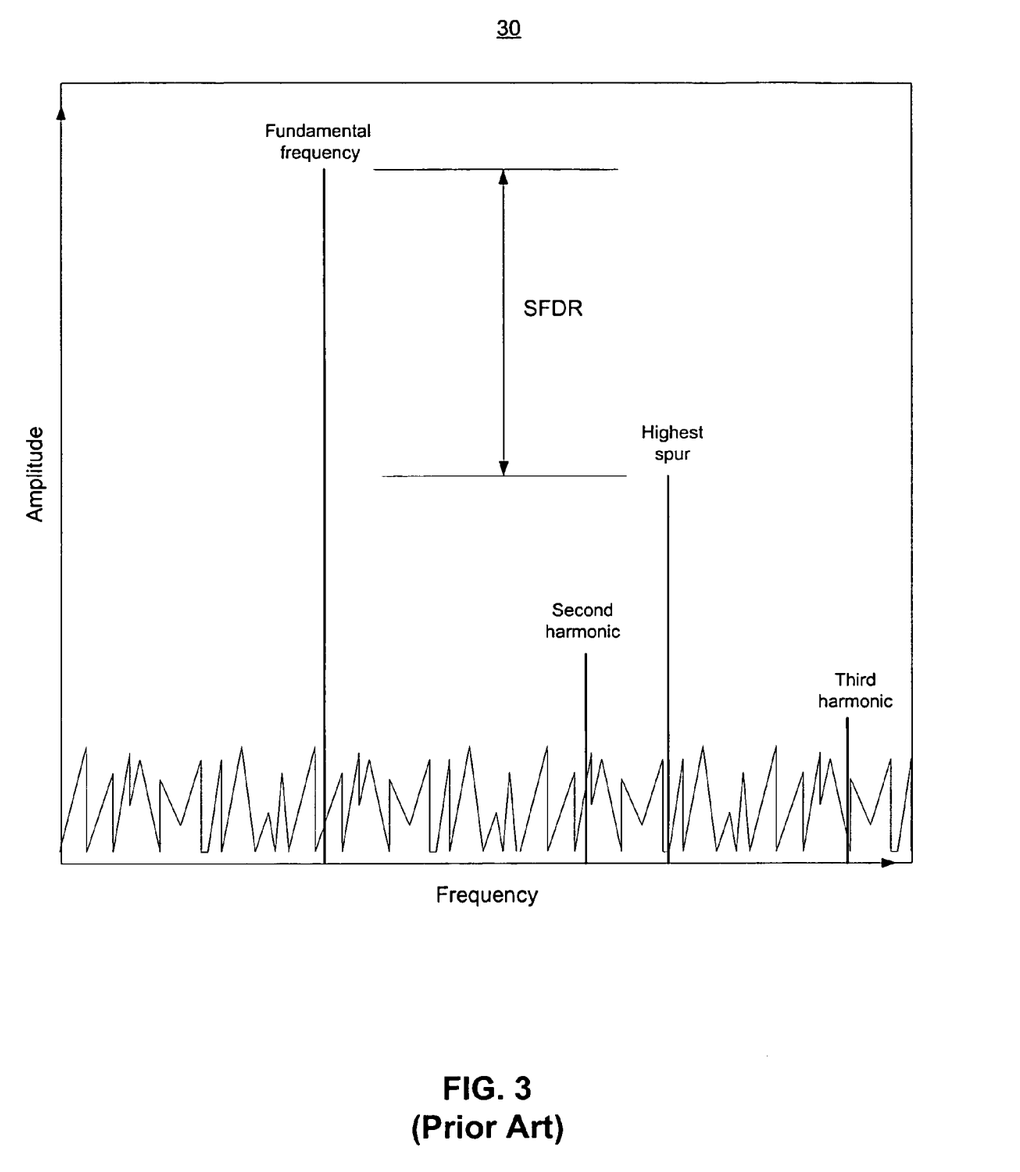
FIG. 3 shows a plot of an output signal generated by a DAC in the frequency domain.

Nonlinearity affects performance, which is often characterized using parameters obtained via frequency-domain analysis and is typically measured by performing a fast Fourier transform (FFT) on the analog output of the DAC. FIG. 3 shows a plot 30 of the DAC output in the frequency domain. The fundamental frequency is equal to the frequency of the digital input (i.e., the signal measured with the DAC). All other frequency components are unwanted signals that result from harmonic distortion, thermal noise, 1/f noise, and quantization noise. Some sources of noise may not originate from the DAC itself. For example, distortion and thermal noise originate from the external circuit at the input to the DAC.

Nonlinearity in the data converter results in harmonic distortion when analyzed in the frequency domain. Such distortion is observed as "spurs" in the FFT at harmonics of the measured signal as illustrated in FIG. 3. Nonlinearity also produces spurs within the Nyquist frequency of the DAC at frequencies that are not harmonics of the fundamental frequency. The ratio between the magnitude of the measured signal and its highest spur peak is referred to as "spurious-free dynamic range" (SFDR), and is often expressed in decibels (dB). The highest spur could be a harmonic of the measured signal or non-harmonic component, depending on the application. SFDR depends on the fundamental frequency of the input signal. As the fundamental frequency increases, the SFDR tends to decrease.

SUMMARY

The invention provides methods and systems, including computer program products, for converting an input signal to an output signal.

In general, in one aspect, the invention features a system that includes a first converter having a first performance specification for use with frequencies above a frequency threshold; a second converter having a second performance specification for use with frequencies below the frequency threshold; and a frequency multiplexer coupled the first and second converters. The frequency multiplexer includes a high-pass crossover filter coupled to the first converter in which the high-pass crossover filter is configured to transmit high-frequency components of the input signal to the first converter and to attenuate low-frequency components of the input signal to a predetermined level such that the low-frequency components can be used to correct non-linearity errors introduced by the first converter. The high-frequency components are above the frequency threshold and the low frequency components are below the frequency threshold. The frequency multiplexer also includes a low-pass crossover filter coupled to the second converter in which the low-pass crossover filter is configured to transmit the low-frequency components of the input signal to the second converter and to attenuate the high-frequency components of the input signal to a predetermined level such that the high-frequency components can be used to correct non-linearity errors introduced by the second converter; and a combiner coupled the first and second converters that is configured to combine first and second converted signals received from the first and second converters to form the output signal.

Embodiments may include one or more of the following. The combiner may include a high-pass crossover filter coupled to the first converter that is configured to attenuate the low-frequency components of the first converted signal to a predetermined level; and a low-pass crossover filter coupled to the second converter that is configured to attenuate the high-frequency components of the second converted input signal to a predetermined level. The first and second performance specifications may include spurious-free dynamic-range specifications. The first converter may include a first digital-to-analog converter and the second converter comprises a second digital-to-analog converter. A lookup table may be coupled to the frequency multiplexer and configured to determine that a value of the input signal corresponds to an input code of the second converter and to express a compensation value corresponding the input code such that the compensation value causes the first converted signal to at least partially cancel a linearization error that is present in the second converted signal. The lookup table may include virtual bits that are configured to extend a number of physical bits of the second converter. The frequency multiplexer may also include a summer configured to add the compensation value to the input signal. A dithering module may be coupled to the frequency multiplexer and to the first and second converters. The dithering module may include a dithering signal generator configured to generate a dithering signal comprising a sequence of random values; negating circuitry, coupled to the dithering signal generator, that generates a dithering-cancellation signal comprising a sequence of values that are equal and opposite to the random values of the dithering signal; a first summer configured to add the dithering signal to the high-frequency components of the input signal; and a second summer configured to add the dithering-cancellation signal to the low-frequency components of the input signal. The dithering module may also include a first equalizer, coupled to the dithering signal generator, having a transfer function that is an inverse of a transfer function of the high-pass filter of the combiner; and a second equalizer, coupled to the negating circuitry, having a transfer function that is an inverse of a transfer function of the low-pass filter of the combiner. The dithering signal may be configured to attenuate spurs in the output signal and the dithering-cancellation signal may at least partially cancel distortion in the output signal caused by the dithering signal.

In another aspect, the invention features a method and a computer program produce for converting an input signal to an output signal. The method includes receiving the input signal; transmitting high-frequency components of the input signal to a first converter, (the high-frequency components being above a frequency threshold); attenuating low-frequency components of the input signal to a predetermined level such that the low-frequency components of dither can be used to correct non-linearity errors introduced by the first converter; transmitting the low-frequency components of the input signal to a second converter, (the low-frequency components being below the frequency threshold); attenuating the high-frequency components of the input signal to a predetermined level such that the high-frequency components of linearization correction and dither can be used to correct non-linearity errors introduced by the second converter; converting the high-frequency components to form a first converted signal; converting the low-frequency components to form a second converted signal; and combining the first and second converted signals to form the output signal.

Embodiments may include one or more of the following. Transmitting the high-frequency components may include attenuating the low-frequency components of the input signal, and transmitting the low-frequency components may include attenuating the high-frequency components of the input signal. Converting the high-frequency and low frequency components may include converting digital signals to analog signals. Converting the high-frequency and low frequency components may include converting analog signals to digital signals. A linearization error of the second converter that corresponds to an input code may be measured and stored in a lookup table. A value of the input signal that corresponds the input code may be determined, and a compensation value corresponding to the input code may be expressed such that the compensation value causes the first converted signal to at least partially cancel a linearization error that is present in the second converted signal.

A dithering signal comprising sequence of random values may be generated; a dithering-cancellation signal comprising a sequence of values that are equal and opposite to the random values of the dithering signal may be generated; the dithering signal may be added to the high-frequency components of the input signal to attenuate spurs in the output signal; and the dithering-cancellation signal may be added to the low-frequency components of the input signal to at least partially cancels distortion in the output signal caused by the dithering signal.

The details of one or more embodiments of the invention are set forth in the accompanying drawings and the description below. Other features, objects, and advantages of the invention will be apparent from the description and drawings, and from the claims.

DETAILED DESCRIPTION

Although SFDR depends on frequency, the SFDR over a given frequency range may be larger or smaller in other DACs. Typically a DAC will optimize SFDR in different frequency ranges. For example, a first DAC optimizes SFDR in a frequency range below a given frequency threshold, and a second DAC optimizes SFDR in a frequency range above that frequency threshold.

The DAC plays a role in an arbitrary waveform generator (AWG). The performance of the AWG depends greatly on the performance of the DAC. For testing some state-of-art devices, the best available DAC at the time the instrument is designed may not have sufficient SFDR. Furthermore, it is desirable to optimize SFDR across a large range of frequencies that may be greater than any one optimized range of a DAC.

Figure 4:
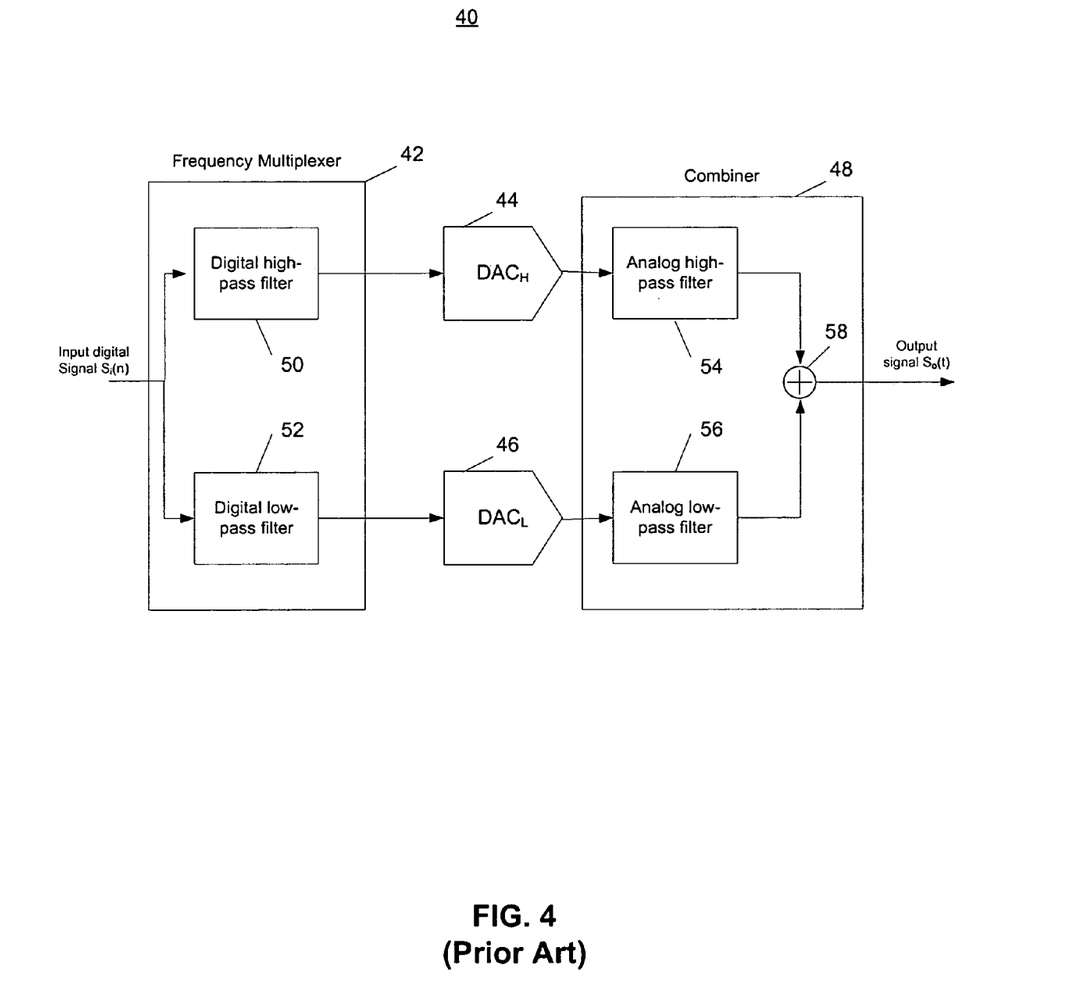
FIG. 4 shows a converter system.

FIG. 4 shows a converter system 40 for converting an input digital signal $S_i(n)$ to an analog output signal $S_o(t)$ using multiple DAC's ($DAC_H$ 44 and $DAC_L$ 46) so the overall SFDR of the converter system 40 is better than the SFDR of either the DACH 44 or the $DAC_L$ 46.

Figure 5:
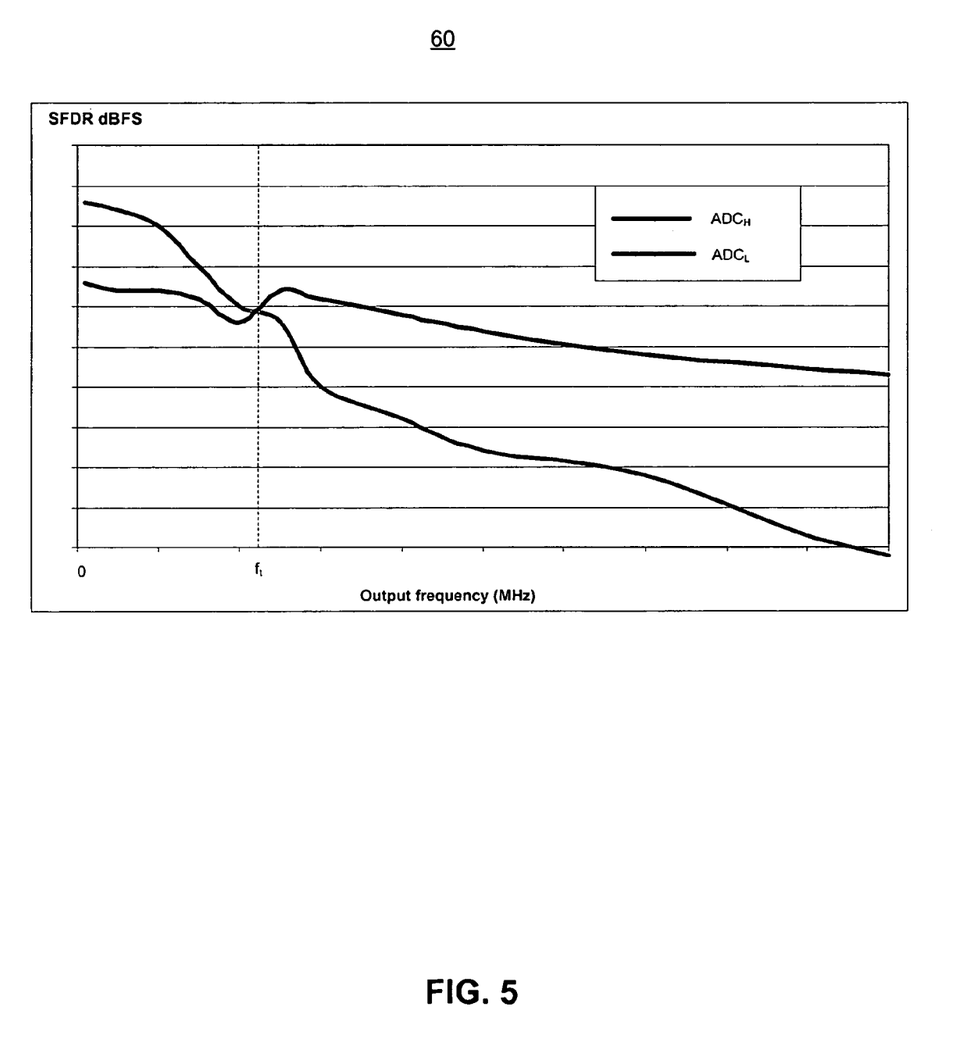
FIG. 5 shows a plot of spurious-free dynamic range for two different DACs.

The converter system 40 includes a first DAC ($DAC_H$ 44) that optimizes SFDR for frequencies above a frequency threshold ($f_t$), a second DAC ($DAC_L$ 46) that optimizes SFDR for frequencies below the frequency threshold(see FIG. 5). The converter system 40 also includes a frequency multiplexer 42 that receives a digital input signal $S_i(n)$, and a combiner 48 that outputs an analog output signal $S_o(t)$. The frequency multiplexer 42 includes a digital high-pass filter 50, and a digital low-pass filter 52. The digital high-pass filter 50 attenuates the frequency components of the input signal $S_i(n)$ that are below the threshold frequency and passes the higher frequency components to the $DAC_H$ 44. For ease of explanation, the range of frequencies that are below the threshold frequency will be referred to as the "low frequency range" and the range of frequencies that are above the threshold frequency will be referred to as the "high frequency range." The digital low-pass filter 52 attenuates the frequency components of the input signal $S_i(n)$ that are in the high frequency range and passes components in the low frequency range to the $DAC_L$ 46. The $DAC_H$ 44 and the $DAC_L$ 46 convert the respective digital outputs of the digital high-pass and low-pass filters 50 and 52 to analog signals.

The combiner 48 includes an analog high-pass filter 54, an analog low-pass filter 56, and a summer 58. The analog filters 54 and 56 filter out unwanted frequency components, such as spurs, that result from conversion processes performed by the $DAC_H$ 44 and the $DAC_L$ 46. The analog high-pass filter 54 receives the analog signal produced by the $DAC_H$ 44 and attenuates the frequency components that lie in the low frequency range. The analog low-pass filter 56 receives the analog signal produced by the $DAC_L$ 46 and attenuates the frequency components of the signal that lie in the high frequency range. The output of the analog high-pass filter 54 includes the high-frequency components of the input digital signal $S_i(n)$ having a SFDR specified for the $DAC_H$ 44 (i.e., the SFDR that is optimized for the high frequency range). Similarly, the output of the analog low-pass filter 56 includes the low-frequency components of the input digital signal $S_i(n)$ having a SFDR specified for the $DAC_L$ 46 (i.e., the SFDR that is optimized for the low frequency range). The summer 58 adds together the analog signals produced by each of the analog filters 54 and 56 to produce the analog output signal $S_o(t)$.

Figure 6:
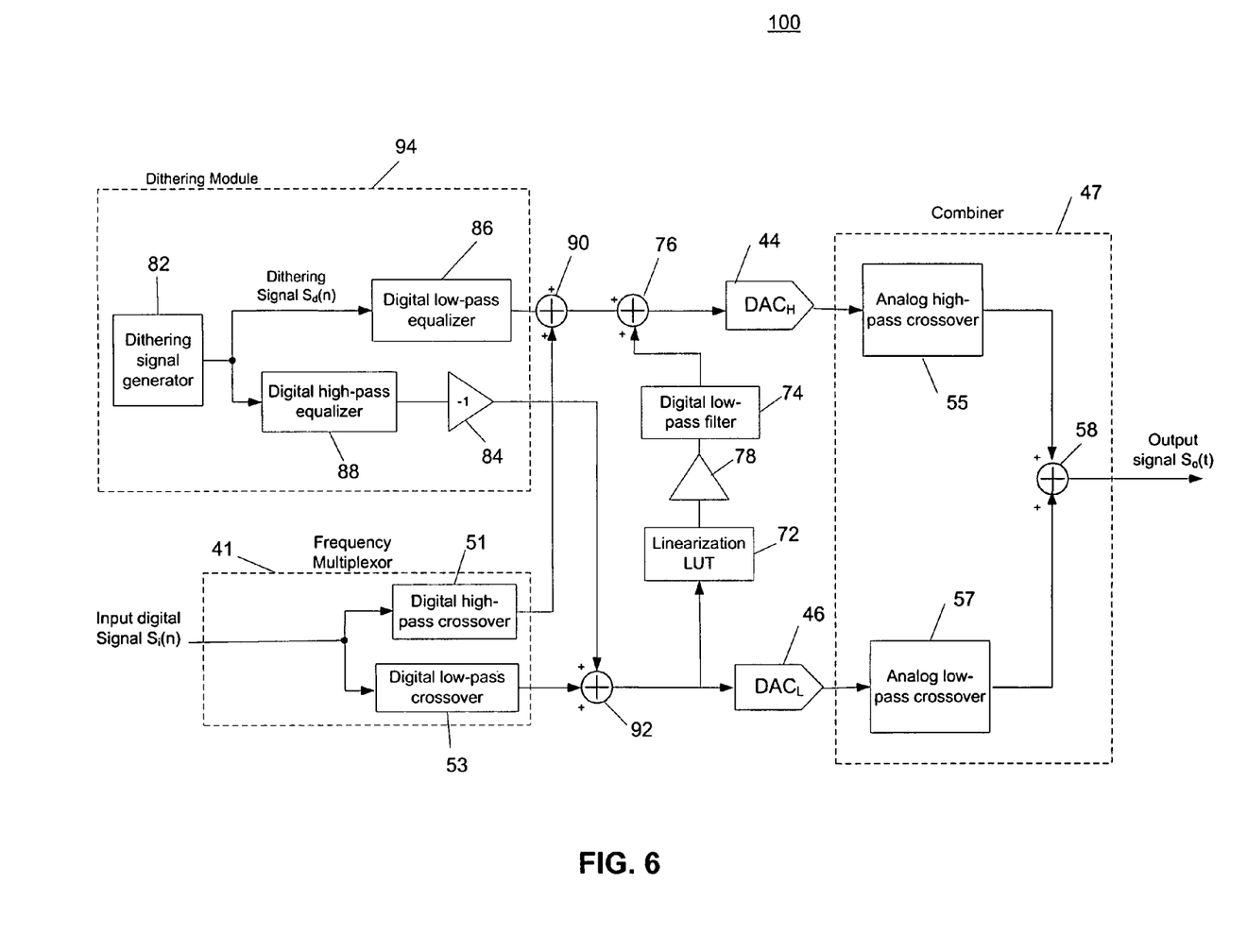
FIG. 6 shows another converter system that includes linearization and dithering modules.

For any waveform at the input of the system, we can divide that waveform into higher frequency components and lower frequency components. For example if the frequency components of the input signal $S_i(n)$ are of a low frequency, the signal generated by the $DAC_L$ 46 (i.e., the converter with the better performance at low frequency) provides a larger contribution to the output signal $S_o(t)$ than does the $DAC_H$ 44 due to digital low-pass filter 52. For ease of explanation, the DAC with the higher performance for a given input signal $S_i(n)$ will be referred to as the "main converter" and the other DAC will be referred to as the "auxiliary converter." In this case $DAC_L$ 46 is the main converter and $DAC_H$ 44 is the auxiliary converter. Furthermore, because $DAC_L$ 46 is optimized for the low frequency range, the contribution of the signal from $DAC_L$ 46 degrades the integrity of the output signal $S_o(t)$. That is, the output signal generated solely by $DAC_L$ 46, without any contribution from $DAC_H$ 44 being added, would have a higher SFDR than the output $S_o(t)$ that includes the contribution from $DAC_H$ 44. Short of disconnecting $DAC_H$ 44 from the converter system 40, in this scenario, the contribution from $DAC_H$ 44 cannot be completely set to zero in practice because the digital high-pass filter 42 and the analog high-pass filter 54 are not ideal and thus do not completely attenuate signals in their respective stop bands. In the converter system 40, the contribution of the signal from the auxiliary converter (referred to as the "auxiliary signal"), whether the auxiliary converter is the $DAC_H$ 44 or the $DAC_L$ 46, is apparently undesirable. FIG. 6 shows a block diagram of a converter system 100 that modifies the converter system 40 of FIG. 4 such that the contribution of the auxiliary signal improves the integrity of the output signal $S_o(t)$. Converter system 100 includes a linearization look-up table (LUT) 72, a digital low-pass filter 74, a gain stage 78, digital summers 76, 90 and 92, a dithering module 94, a frequency multiplexer 41, a combiner 47, a $DAC_H$ 44 serving as the main converter for a high frequency input signal or auxiliary converter for a low frequency input signal, and a $DAC_L$ 46 serving as the main converter for a low frequency input signal or auxiliary converter for a high frequency input signal. The dithering module 94 includes a dithering-signal generator 82, a negating circuit 84, a digital low-pass equalizer 86, and a digital high-pass equalizer 88. The frequency multiplexer 41 includes a digital high-pass crossover filter 51 and a digital low-pass crossover filter 53. The combiner 47 includes an analog high-pass crossover filter 55, an analog low-pass crossover filter 57, and a summer 58 that adds the outputs of each of the analog crossover filters 55 and 57. Unlike the filters 50, 52, 54, and 56 of the converter 40 (shown in FIG. 4) the attenuation at stop band of these crossover filters 51, 53, 55, and 57 of converter 100 have been intentionally limited to a predetermined level so that a signal can pass through the filter even if the signal lies in the stop band. The attenuation level of the crossover filters 51, 53, 55, and 57 are adjusted so that the spurs produced from the auxiliary converter in the optimized frequency range are significantly lower in magnitude than the spurs produced by the main converter for the optimized frequency range. In some embodiments, the crossover filters are adjusted so that the spurs from the auxiliary converter are at least 10 dB less than the corresponding spurs produced by the main converter. This ensures that the spurs produced by the auxiliary converter are negligible. For example, if $DAC_H$ 44 is the main converter and has an SFDR that is approximately 10 dB higher than the auxiliary converter $DAC_L$ 46 for a high frequency range, the low-pass crossover filters 53 and 57 are configured to attenuate a signal components in their stop bands by 20 dB to ensure that the spurs produced by $DAC_L$ 46 in the high frequency range are less than the spurs produced by $DAC_H$ 46 in that range by at least 10 dB.

For each input code of the main DAC (in this case, $DAC_L$ 46) the linearization LUT 72 stores a corresponding linearity correction that was previously measured and calculated for each of the $DAC_L$ codes. When the LUT 72 receives a code of the input digital signal $S_i(n)$, it looks up the linearization error stored for that code and applies and expresses an equal and opposite voltage value. The summer 76 adds this voltage value to the input of the $DAC_H$ 44 to cancel the linearization error that results when the $DAC_L$ 46 converts the code to an analog value. Introducing linearization error compensation values into the input signal $S_i(n)$ brings the analog output of the $DAC_L$ 46 closer to its ideal level. The digital gain stage 78 compensates for the attenuation in the stop band of high-pass filter 55. In some embodiments, the digital gain stage 78 could be physically built into the LUT 72. In some embodiments, the LUT 72 assigns, to each code, a first linearization error that results when the DAC transitions from a higher code, and a second linearization error that results when the DAC transitions from a lower code. In other embodiments, the first and second linearization errors are substantially the same and therefore only one linearization error value is stored for each code.

In some embodiments, this linearization is not only limited to the $DAC_L$ 46 physical number of bits. In these embodiments, the $DAC_L$ 46 has some virtual bits that do not produce any output. In these embodiments, the output of the $DAC_H$ 44 may be used to linearize these virtual bits to build a combined DAC having more bits than just the $DAC_L$ 46 alone.

Compensating for linearization in this way works better at low frequencies (e.g., frequencies below approximately 1 MHz). At higher frequencies, the DAC transfer function is frequency dependent and the linearization error depends on the frequency of the signal. Linearization is inefficient at higher frequencies as the non-linearity changes with frequency. Therefore, compensating for linearization is used mainly when the $DAC_L$ 46 is the main converter (i.e., when the main frequency component of the input signal $S_i(n)$ is in the low frequency range). High linearity is typically important for lower frequencies in the audio range (e.g., between zero and approximately 20 KHz). The digital low-pass filter 74 removes high frequency noise produced by linearization. In some embodiments, system 100 has a SFDR value greater than 120 DB in the audio frequency range.

Spurs that are generated from converting a high frequency signal are often caused by the dynamic non-linearity of converters. Therefore, the linearization technique described above for lower frequency input signals is less useful for higher frequency input signals. Furthermore, the spurs (both harmonic and non-harmonic) are strongly correlated with the input signal. To reduce the correlation between the input signal and the spurs, additive dither noise is added to the input signal $S_i(n)$. The result is that the frequencies at which the spurs appear in the output signal are more randomized over time and therefore spur will be spread through out the entire spectrum. In the case of a repetitive signal, averaging techniques could reduce random noise. For example, by averaging a number of N values of a signal, noise that is present is reduced by a factor of approximately the square root of N. In the case of spurs that are correlated with the transfer function of the converter, averaging does not help to reduce their contribution because they are not random and always show up at the same frequency for a given DAC transfer function. Dithering will make the spur random, so averaging in presence of dither will become effective.

The dithering is performed by dithering module 94. The dithering module 94 dithers the input of each converter to attenuate unwanted spurs that result in their outputs. The dither signal generator 82 generates a dither signal $S_d(n)$, which is a sequence of random numeric value of a few LSB around zero. The dither could have narrow band or broadband spectrum. The summer 90 and 92 add the dither signals at the inputs of converters 44 and 46 with samples of the input signal $S_i(n)$ after it passes through the digital crossover filters 51 and 53. The dither signal added to the input of converters reduces the correlation of the spurs to the signal at the expense of adding a higher noise level to the output of each converter. The combined transfer function of digital low-pass equalizer 86 and analog high-pass crossover filter 55 should be equal to combined transfer function of digital high-pass equalizer 88 and analog low-pass crossover filter 57. The digital equalizers 86 and 88 compensate the effect of the analog crossover filters 55 and 57 so that the dither signal generated by the same generator 82 produce two dither signals of opposite amplitude at the combiner 58. The digital equalizers are designed such that the dither noise produced by the $DAC_H$ 46 can be used to cancel out the dithering noise added to the input of the $DAC_L$ 44 at low frequency range and the dither noise produced by the $DAC_L$ 44 can be used to cancel out the dithering noise added to the input of the $DAC_H$ 46 at high frequency range.

The output of the analog high-pass crossover filter 55 includes the output waveform with the added dithering noise. The output of the analog low-pass crossover filter 57 also includes the output waveform, though at an attenuated level, and added noise that is equal and opposite of the dithering noise. For ease of explanation, this added noise will be referred to as a "correction waveform." When the outputs of the analog high-pass and low-pass crossover filters 55 and 57 are added, the correction waveform cancels the dithering noise yielding the output waveform that includes both contributions from the $DAC_H$ 44 and the $DAC_L$ 46. To ensure that the dithering noise and the correction waveform have the same amplitude, the correction waveform is amplified, by the digital high-pass equalizer 88, to compensate for the attenuation of the crossover filters. For example, if the analog low-pass crossover filter has a stopband attenuation of 20 dB, the magnitude of the correction waveform would need to be boosted by 20 dB.

The correction waveform is produced by negating the dithering signal $S_d(n)$ using the negating circuitry 84 to produce a digital signal having sample values that are equal and opposite to the sample values of the dithering signal $S_d(n)$. The correction waveform is then passed through the digital high-pass equalizer 88. The summer 92 adds the output of the digital high-pass equalizer 88 to that of the digital low-pass crossover filter 53. Thus, the correction waveform cancels the offsets produced by the dithering signal $S_d(n)$. If for example, the input signal $S_i(n)$ were zero and dithering signal $S_d(n)$ were generated, ideally, the output signal $S_o(t)$ would also be zero. In some embodiments, the negation circuitry 84 is absent from the converter 100 and the negation operations of the negating circuitry 84 are performed by the summer 92.

The dithering signal $S_d(n)$ can be added to either the output signal from the digital high-pass crossover filter 51 or the output of the digital low-pass crossover filter 53. For example, the negating circuitry 84 could be coupled to the digital low-pass equalizer 86 rather than to the digital high-pass equalizer 88.

In FIG. 6, the linearization LUT 72 is arranged so that the output of the $DAC_H$ 44 compensates non-linearities introduced by the $DAC_L$ 46. The dithering module 94, however, is arranged so that it dithers the portion of the input signal that lies in the high frequency range. Dithering the output signal to randomize spurs is particularly advantageous when the $DAC_H$ 44 is the main converter and when the frequency components of the input signal $S_i(n)$ are too high to efficiently correct for nonlinearity using linearization LUT 72. In some embodiments, the dithering module 94 is arranged to dither the portion of the input signal $S_i(n)$ that lies in the low frequency range. In some of these embodiments, the LUT 72 is also arranged so that the output of $DAC_L$ 46 compensates non-linearities introduced by $DAC_H$ 44, provided that the main frequency components of the input signal are sufficiently low so that the transfer function of $DAC_H$ 44 is nearly frequency-independent.

Figure 7:
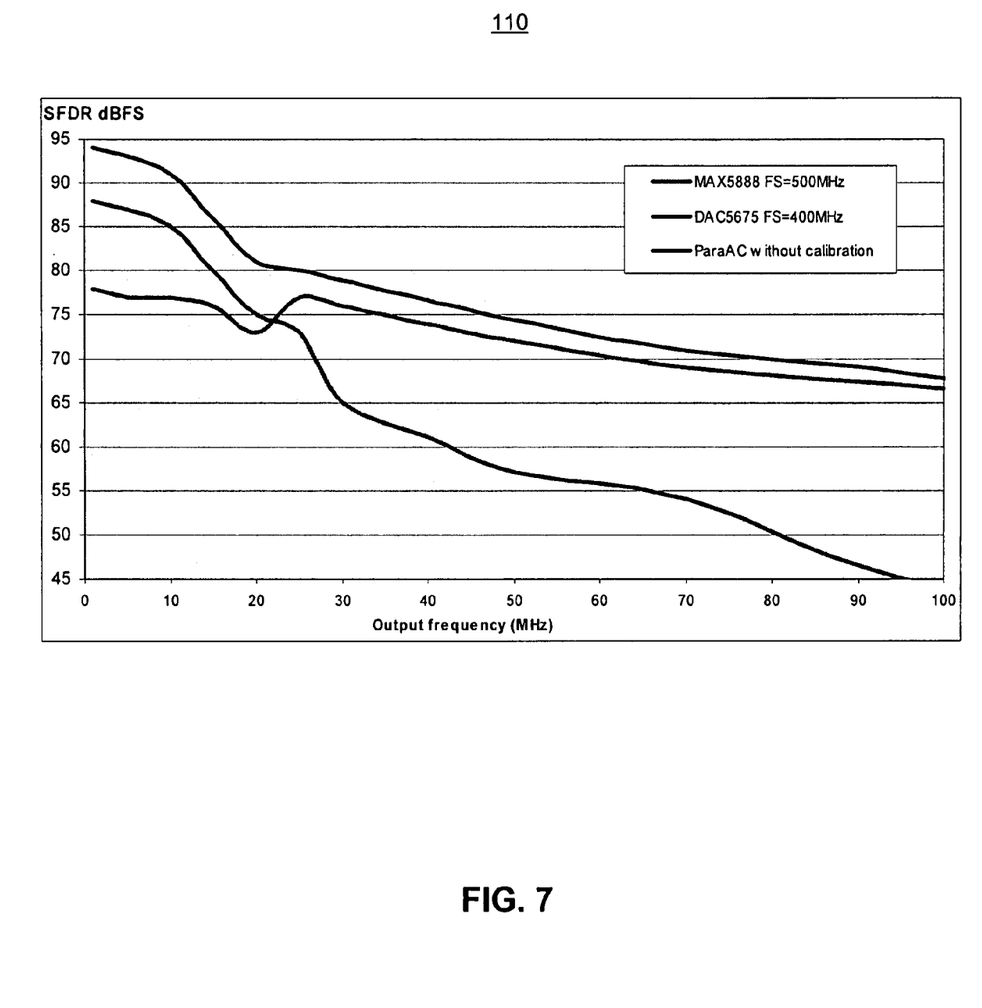
FIG. 7 shows a plot of spurious-free dynamic range for the converter system of FIG. 6.

FIG. 7 shows a plot 110 of SFDR versus output frequency that were measured for the $DAC_H$ 44, the $DAC_L$ 46, and the converter system 100 shown in FIG. 6. The $DAC_H$ 44 is a Texas Instruments® DAC5675 operating at a sampling frequency of 400 MHz and the $DAC_L$ 46 is a MAXIM® MAX5888 operating at a sampling frequency of 400 MHz. As evident from the plot, the performance of the converter system 100 is better than the performance of either the $DAC_H$ 44 or the $DAC_L$ 46.

Figure 8:
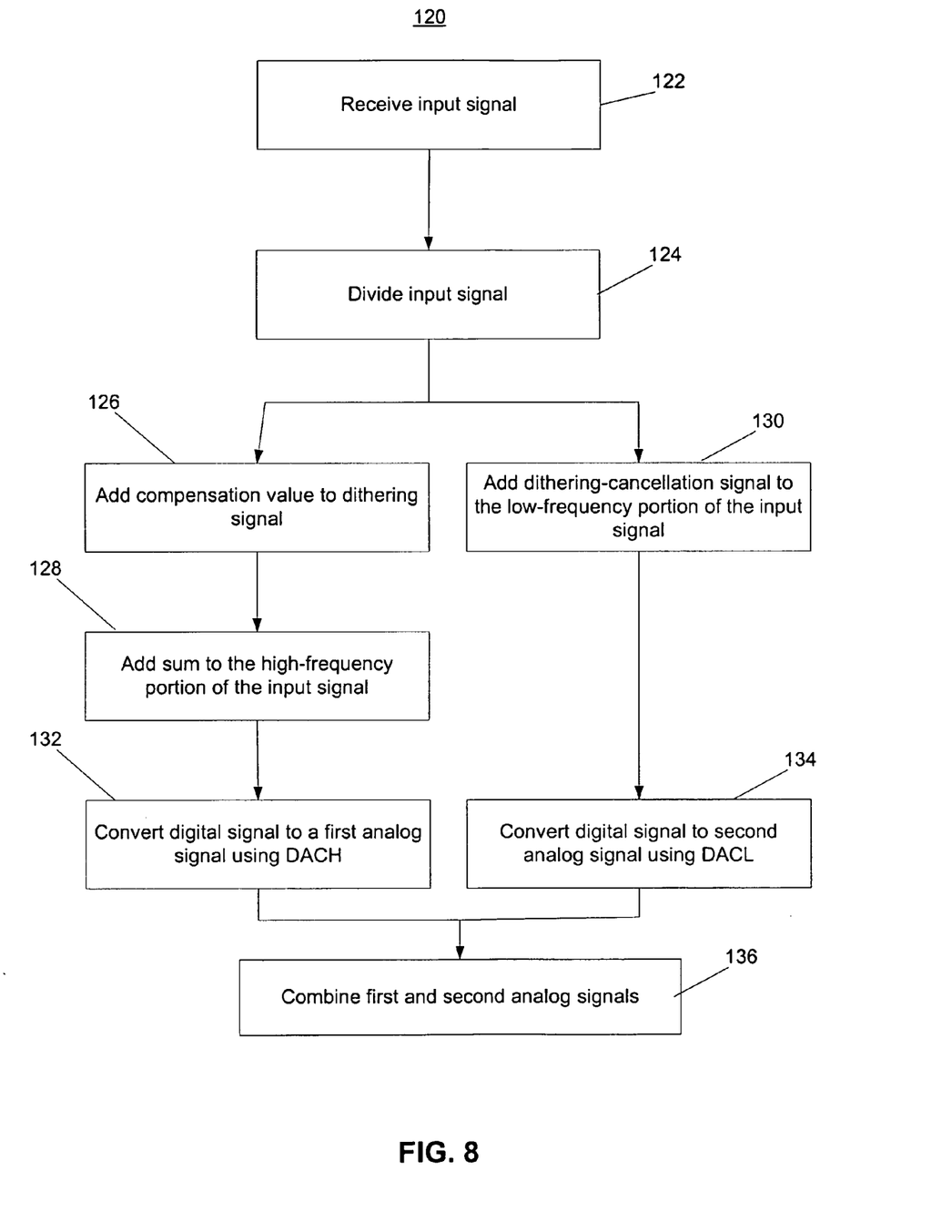
FIG. 8 shows a flowchart of a process for converting a digital signal to an analog signal using the converter system shown in FIG. 6.

Referring to FIG. 8, a process 120 for converting an digital input signal $S_i(n)$ to an analog output signal $S_o(t)$ using the converter system 100 shown in FIG. 6. The frequency multiplexer 42 receives (122) the digital input signal $S_i(n)$ and divides (124) the signal into its high and low frequency components. The linear compensation value produced by the linearization LUT 72 is added (126) to the dithering signal generated by the dithering signal generator 82. The result is then passed through the digital low-pass equalizer 86 and added (128) to the high frequency components of the input signal by summer 90. A dithering-cancellation signal, which is equal and opposite to the dithering signal, is produced at the output of the negating circuitry 84. The result is then passed through the digital high-pass equalizer 88 and added (130) to the low frequency components of the input signal by summer 92. The $DAC_H$ 44 converts (132) the signal produced by summer 90 to a first analog signal and the $DAC_L$ 46 converts (134) the signal produced by summer 90 to a second analog signal. The analog outputs of $DAC_H$ 44 and $DAC_L$ 46 are filtered by the analog high-pass and low-pass crossover filters 55 and 57. The summer 58 then combines (136) the signals received from the analog high-pass and low-pass crossover filters 55 and 57 to form the output signal $S_o(t)$.

Figure 9:
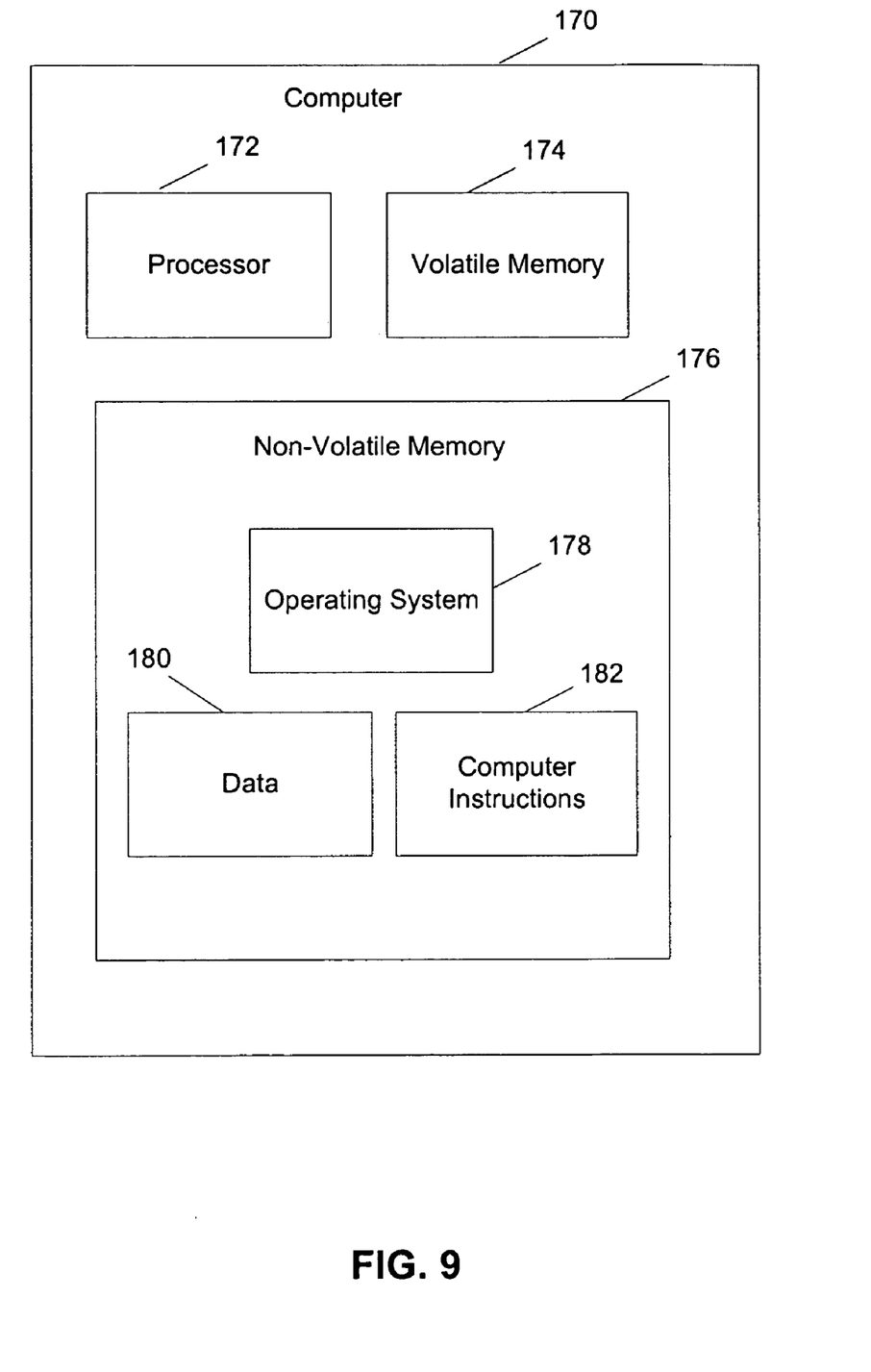
FIG. 9 shows a block diagram of a computer for implementing the process shown in FIG. 8.

FIG. 11 shows a computer 170 for performing the digital-to-analog conversion process 120. Computer 170 includes a processor 172, a volatile memory 174, and a non-volatile memory 176 (e.g., hard disk). Non-volatile memory 176 stores operating system 178, data 180, and computer instructions 182 which are executed by processor 172 out of volatile memory 174 to perform process 100.

Process 120 is not limited to use with the hardware and software described herein. Process 120 can be implemented in digital electronic circuitry, or in computer hardware, firmware, software, or in combinations thereof.

Process 120 can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Digital data to be sent to each DAC could be computed in real time when an analog waveform is generated or off-line and stored in a memory device.

Method steps associated with implementing process 120 can be performed by one or more programmable processors executing one or more computer programs to perform the functions of the processes. All or part of process 120 can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

The circuitry described herein, including the frequency multiplexer 41, the linearization LUT 72, the dithering module 94, the $DAC_H$ 44, the $DAC_L$ 46, and the combiner 47, may be implemented as part of converter systems 40 and 100 or as separate circuitry for use in conjunction with converter systems 40 and 100.

A number of embodiments of the invention have been described. Nevertheless, it will be understood that various modifications may be made. For example, converter systems 40 and 100 could be modified to convert an analog input to a digital output by replacing the $DAC_H$ 44 with an analog-to-digital converter (ADC) having an SFDR that is optimized for the high frequency range and by replacing the $DAC_L$ 46 with an ADC having an SFDR that is optimized for the low frequency range. Accordingly, other embodiments are within the scope of the following claims.

What is claimed is:

1. A system for converting an input signal to an output signal, the system comprising:
   a first converter having a first performance specification for use with frequencies above a frequency threshold;
   a second converter having a second performance specification for use with frequencies below the frequency threshold;
   a frequency multiplexer coupled the first and second converters, wherein the frequency multiplexer comprises:
      a high-pass crossover filter coupled to the first converter, wherein the high-pass crossover filter is configured to transmit high-frequency components of the input signal to the first converter and to attenuate low-frequency components of the input signal to a predetermined level such that the low-frequency components can be used to correct non-linearity errors introduced by the first converter, wherein the high-frequency components are above the frequency threshold and the low frequency components are below the frequency threshold;
      a low-pass crossover filter coupled to the second converter, wherein the low-pass crossover filter is configured to transmit the low-frequency components of the input signal to the second converter and to attenuate the high-frequency components of the input signal to a predetermined level such that the high-frequency components can be used to correct non-linearity errors introduced by the second converter; and
   a combiner coupled the first and second converters, wherein the combiner is configured to combine first and second converted signals received from the first and second converters to form the output signal.

2. The system of claim 1, wherein the combiner comprises:
   a high-pass crossover filter coupled to the first converter, wherein the high-pass crossover filter is configured to attenuate the low-frequency components of the first converted signal to a predetermined level; and
   a low-pass crossover filter coupled to the second converter, wherein the low-pass crossover filter is configured to attenuate the high-frequency components of the second converted input signal to a predetermined level.

3. The system of claim 1, wherein the first and second performance specifications comprise spurious-free dynamic-range specifications.

4. The system of claim 1, wherein the first converter comprises a first digital-to-analog converter and the second converter comprises a second digital-to-analog converter.

5. The system of claim 1, further comprising a lookup table coupled to the frequency multiplexer, wherein the lookup table is configured to:
   determine that a value of the input signal corresponds to an input code of the second converter; and
   express a compensation value corresponding the input code such that the compensation value causes the first converted signal to at least partially cancel a linearization error that is present in the second converted signal.

6. The system of claim 5, wherein the lookup table comprises virtual bits that are configured to extend a number of physical bits of the second converter.

7. The system of claim 5, wherein the frequency multiplexer further comprises a summer configured to add the compensation value to the input signal.

8. The system of claim 2, further comprising a dithering module coupled to the frequency multiplexer and to the first and second converters, wherein the dithering module comprises:
- a dithering signal generator configured to generate a dithering signal comprising a sequence of random values;
- negating circuitry coupled to the dithering signal generator, wherein the negating circuitry generates a dithering-cancellation signal comprising a sequence of values that are equal and opposite to the random values of the dithering signal;
- a first summer configured to add the dithering signal to the high-frequency components of the input signal; and
- a second summer configured to add the dithering-cancellation signal to the low-frequency components of the input signal.

9. The system of claim 8, wherein the dithering module further comprises:
- a first equalizer coupled to the dithering signal generator, wherein the first equalizer comprises a transfer function that is an inverse of a transfer function of the high-pass filter of the combiner; and
- a second equalizer coupled to the negating circuitry, wherein the second equalizer comprises a transfer function that is an inverse of a transfer function of the low-pass filter of the combiner.

10. The system of claim 8, wherein the dithering signal is configured to attenuate spurs in the output signal and wherein the dithering-cancellation signal at least partially cancels distortion in the output signal caused by the dithering signal.

11. A method for converting an input signal to an output signal, the method comprising:
- receiving the input signal;
- transmitting high-frequency components of the input signal to a first converter, wherein the high-frequency components are above a frequency threshold;
- attenuating low-frequency components of the input signal to a predetermined level such that the low-frequency components of dither can be used to correct non-linearity errors introduced by the first converter;
- transmitting the low-frequency components of the input signal to a second converter, wherein the low-frequency components are below the frequency threshold;
- attenuating the high-frequency components of the input signal to a predetermined level such that the high-frequency components of linearization correction and dither can be used to correct non-linearity errors introduced by the second converter;
- converting the high-frequency components to form a first converted signal;
- converting the low-frequency components to form a second converted signal; and
- combining the first and second converted signals to form the output signal.

12. The method of claim 11, wherein transmitting the high-frequency components comprises attenuating the low-frequency components of the input signal; and wherein transmitting the low-frequency components comprises attenuating the high-frequency components of the input signal.

13. The method of claim 11, wherein converting the high-frequency and low frequency components comprises converting digital signals to analog signals.

14. The method of claim 11, wherein converting the high-frequency and low frequency components comprises converting analog signals to digital signals.

15. The method of claim 11, further comprising:
- measuring a linearization error of the second converter that corresponds to an input code; and
- storing the linearization error and the code in a lookup table.

16. The method of claim 15, further comprising:
- determining that a value of the input signal corresponds the input code; and
- expressing a compensation value corresponding the input code such that the compensation value causes the first converted signal to at least partially cancel a linearization error that is present in the second converted signal.

17. The method of claim 11, further comprising:
- generating a dithering signal comprising sequence of random values;
- generating a dithering-cancellation signal comprising a sequence of values that are equal and opposite to the random values of the dithering signal;
- adding the dithering signal to the high-frequency components of the input signal to attenuate spurs in the output signal; and
- adding the dithering-cancellation signal to the low-frequency components of the input signal to at least partially cancels distortion in the output signal caused by the dithering signal.

18. A computer program product tangibly embodied in one or more machine-readable media, the computer program product comprising instructions that cause one or more processing devices to:
- receive an the input signal;
- transmit high-frequency components of the input signal to a first converter, wherein the high-frequency components are above a frequency threshold;
- attenuate low-frequency components of the input signal to a predetermined level such that the low-frequency components of dither can be used to correct non-linearity errors introduced by the first converter;
- transmit the low-frequency components of the input signal to a second converter, wherein the low-frequency components are below the frequency threshold;
- attenuate the high-frequency components of the input signal to a predetermined level such that the high-frequency components of linearization correction and dither can be used to correct non-linearity errors introduced by the second converter;
- convert the high-frequency components to form a first converted signal;
- convert the low-frequency components to form a second converted signal; and
- combine the first and second converted signals to form the output signal.

19. The computer program product of claim 18 comprising further instructions that cause the one or more processing devices to:
- measure a linearization error of the second converter that corresponds to an input code;
- store the linearization error and the code in a lookup table;
- determine that a value of the input signal corresponds the input code; and
- express a compensation value corresponding the input code such that the compensation value causes the first converted signal to at least partially cancel a linearization error that is present in the second converted signal.

20. The computer program product of claim 18 comprising further instructions that cause the one or more processing devices to:

generate a dithering signal comprising sequence of random values;

generate a dithering-cancellation signal comprising a sequence of values that are equal and opposite to the random values of the dithering signal;

add the dithering signal to the high-frequency components of the input signal to attenuate spurs in the output signal; and     add the dithering-cancellation signal to the low-frequency components of the input signal to at least partially cancels distortion in the output signal caused by the dithering signal.

\* \* \* \* \*